(12) United States Patent
Kubota et al.

(10) Patent No.: US 8,556,017 B2
(45) Date of Patent: Oct. 15, 2013

(54) VEHICULAR POWER SUPPLY SYSTEM

(75) Inventors: Shinya Kubota, Wako (JP); Masao Kawata, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 406 days.

(21) Appl. No.: 12/864,306

(22) PCT Filed: Jan. 23, 2009

(86) PCT No.: PCT/JP2009/051099
§ 371 (c)(1),
(2), (4) Date: Jul. 23, 2010

(87) PCT Pub. No.: WO2009/098953
PCT Pub. Date: Aug. 13, 2009

(65) Prior Publication Data
US 2010/0294580 A1    Nov. 25, 2010

(30) Foreign Application Priority Data
Feb. 7, 2008   (JP) .................... 2008-028098

(51) Int. Cl.
*B60K 1/04*     (2006.01)
*B60K 11/06*    (2006.01)

(52) U.S. Cl.
USPC ........................................ 180/68.5; 180/68.1

(58) Field of Classification Search
USPC ........... 180/68.5, 68.2, 68.1; 429/120; 165/41
See application file for complete search history.

(56) References Cited

U.S. PATENT DOCUMENTS

| | | | |
|---|---|---|---|
| 6,798,658 B2* | 9/2004 | Takedomi et al. | 361/694 |
| 7,654,351 B2* | 2/2010 | Koike et al. | 180/68.5 |
| 7,688,582 B2* | 3/2010 | Fukazu et al. | 361/690 |
| 2007/0040418 A1 | 2/2007 | Ohkuma et al. | |
| 2007/0238015 A1* | 10/2007 | Kubota et al. | 429/120 |
| 2007/0292752 A1* | 12/2007 | Tsuchiya | 429/120 |
| 2009/0260905 A1* | 10/2009 | Shinmura | 180/68.1 |

FOREIGN PATENT DOCUMENTS

| | | |
|---|---|---|
| JP | 2002-144888 A | 5/2002 |
| JP | 2006-318820 A | 11/2004 |
| JP | 2004-345451 A | 12/2004 |
| JP | 2005-324771 A | 11/2005 |
| JP | 2007-22350 A | 2/2007 |
| JP | 2008-62780 A | 3/2008 |
| WO | WO 2007/043691 A1 | 4/2007 |

* cited by examiner

*Primary Examiner* — Frank Vanaman
(74) *Attorney, Agent, or Firm* — Arent Fox LLP

(57) ABSTRACT

A vehicular power supply system is provided in which the interior of a waterproof case is partitioned into a first cooling air passage on the lower side and a second cooling air passage on the upper side, a battery module is cooled with cooling air that is introduced from an intake passage part of a duct member and flows through the first cooling air passage on the lower side, and high voltage electrical components are then cooled by guiding the cooling air to the second cooling air passage on the upper side via an intermediate duct.

7 Claims, 9 Drawing Sheets

FIG.8
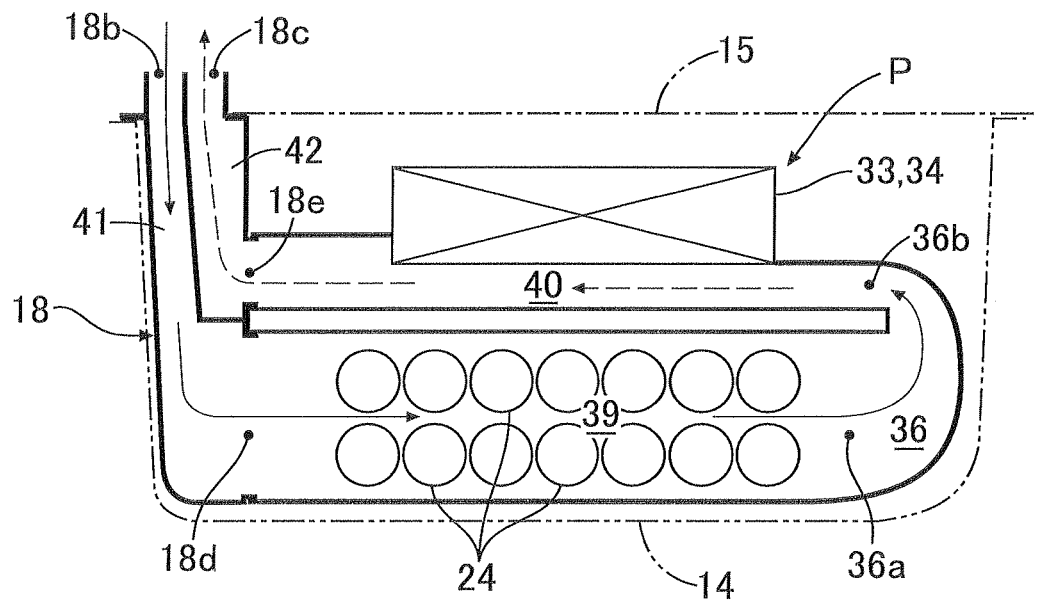
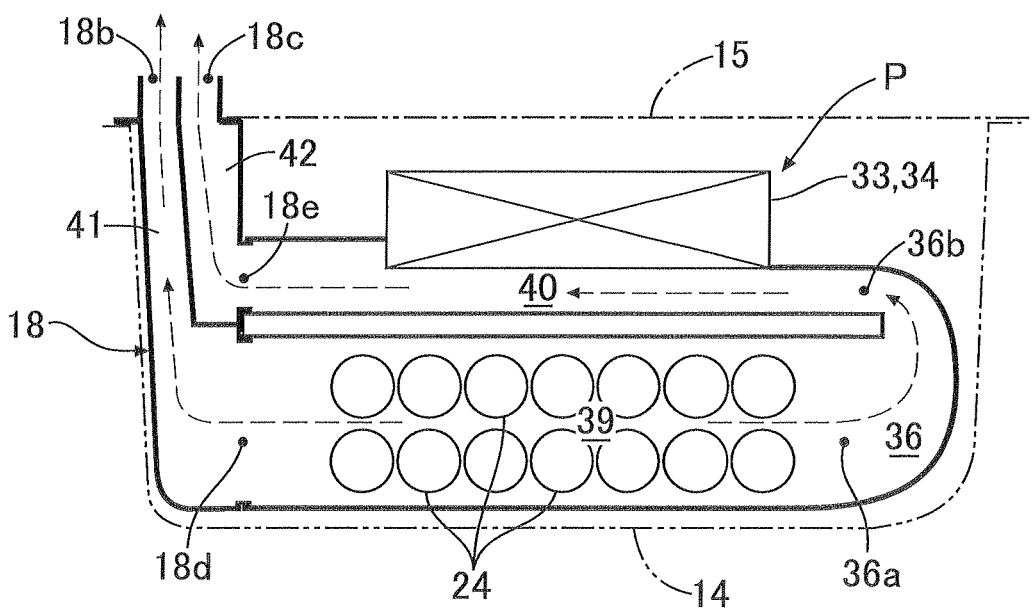

VEHICULAR POWER SUPPLY SYSTEM

CROSS-REFERENCED TO RELATED APPLICATION

This application is a National Stage entry of International Application No. PCT/JP2009/051099, filed Jan. 23, 2009, which claims priority to Japanese Patent Application No. 2008-028098, filed Feb. 7, 2008, the duty of disclosure of the prior application is incorporated in its entirety by reference.

TECHNICAL FIELD

The present invention relates to a vehicular power supply system in which a power unit comprising an electrical condenser and an electrical component is disposed within a case, the interior of the case is partitioned into a first cooling air passage and a second cooling air passage, cooling air is supplied to the first and second cooling air passages by cooling air supply means, the electrical condenser is cooled by cooling air flowing through the first cooling air passage, and the electrical component is cooled by cooling air flowing through the second cooling air passage.

BACKGROUND ART

Among a power supply unit disposed beneath the floor at the rear of a seat of an automobile, an arrangement in which a battery module is disposed in a lower portion thereof, a DC-DC converter and a motor-driving inverter are arranged side by side in the vehicle width direction in an upper portion thereof, cooling air flowing from the front to the rear of a vehicle body is divided into up and down and cools the lower side battery module and the upper side DC-DC converter and motor-driving inverter in parallel is known from Patent Publication 1 below.

Patent Publication 1: Japanese Patent Application Laid-open No. 2008-062780

DISCLOSURE OF INVENTION

Problems to be Solved by the Invention

In the conventional arrangement disclosed above, since the battery module and electrical components are cooled in parallel by providing an intake passage in front of the vehicle body and an exhaust passage at the rear of the vehicle body, the intake passage and exhaust passage are separately provided in fore-and-aft of the vehicle body and there is the problem that the dimension of the power unit in the fore-and-aft direction increases by a portion corresponding thereto.

The present invention has been accomplished in the light of the above-mentioned circumstances, and it is an object thereof to achieve a decrease in size of a vehicular power supply system in which a power unit comprising an electrical condenser and an electrical component are disposed at the interior of a case.

Means for Solving the Problems

In order to attain the above object, according to a first aspect of the present invention, there is provided a vehicular power supply system in which a power unit comprising an electrical condenser and an electrical component is disposed within a case, the interior of the case is partitioned into a first cooling air passage and a second cooling air passage, cooling air is supplied to the first and second cooling air passages by cooling air supply means, the electrical condenser is cooled by cooling air flowing through the first cooling air passage, and the electrical component is cooled by cooling air flowing through the second cooling air passage, wherein a duct member integrally comprising an intake passage part and an exhaust passage part is provided at one end of the case, an outlet opening of the intake passage part is connected to the upstream end of the first cooling air passage, an inlet opening of the exhaust passage part is connected to the downstream end of the second cooling air passage, and the downstream end of the first cooling air passage and the upstream end of the second cooling air passage are connected via an intermediate duct at the other end of the case.

According to a second aspect of the present invention, in addition to the first aspect, the first cooling air passage is provided under the second cooling air passage.

According to a third aspect of the present invention, in addition to the first or second aspect, the electrical component comprises an inverter and a DC-DC converter arranged side by side in the vehicle width direction, and heat sinks extending downward from lower faces of the inverter and the DC-DC converter face the second cooling air passage.

According to a fourth aspect of the present invention, in addition to the first or second aspects, the intake passage part and the exhaust passage part of the duct member provided on one end of the case are formed so as to be adjacent to each other with a partition wall interposed therebetween, an inlet opening of the intake passage part and an outlet opening of the exhaust passage part are dividedly disposed at opposite ends in the lengthwise direction on the one end, the width, in the lengthwise direction, of the outlet opening of the intake passage part is substantially the same as the width, in the lengthwise direction, of the first cooling air passage, and the inlet opening of the exhaust passage part is provided within the width, in the lengthwise direction, of the outlet opening of the intake passage part.

According to a fifth aspect of the present invention, in addition to the first or second aspects, the passage cross-sectional area of the outlet opening of the intake passage part is larger than the passage cross-sectional area of the inlet opening of the intermediate duct, and the passage cross-sectional area of the outlet opening of the intermediate duct is larger than the passage cross-sectional area of the inlet opening of the exhaust passage part.

According to a sixth aspect of the present invention, in addition to any one of the first to fifth aspects, the intermediate duct is formed in a U-shape that curves smoothly from the downstream end of the first cooling air passage to the upstream end of the second cooling air passage.

According to a seventh aspect of the present invention, in addition to the first or second aspects, an intake duct connected to the inlet opening of the intake passage part of the duct member extends toward the front of the vehicle body, and an exhaust duct connected to the outlet opening of the exhaust passage part of the duct member extends toward the rear of the vehicle body.

According to an eighth aspect of the present invention, in addition to the first or second aspects, the power unit is disposed underneath a floor of a luggage compartment interposed between left and right side frames.

A waterproof case 14 of an embodiment corresponds to the case of the present invention, a cooling fan 21 of the embodiment corresponds to the cooling air supply means of the present invention, a battery module 24 of the embodiment corresponds to the electrical condenser of the present invention, and an inverter 33 and a DC-DC converter 34 of the embodiment correspond to the electrical component of the present invention.

Effects of the Invention

In accordance with a first aspect of the present invention, since the intake passage part and the exhaust passage part are provided integrally with the duct member provided at one end of the case in which the power unit comprising the electrical condenser and the electrical component is disposed, compared with an arrangement in which they are provided separately at opposite ends of the case, the size of the power supply system can be made smaller.

In accordance with a second aspect of the present invention, since the first cooling air passage is provided under the second cooling air passage, after the electrical condenser is cooled by cooling air, introduced via the intake passage part of the duct member, flowing through the first cooling air passage, the electrical component is cooled by guiding the cooling air to the second cooling air passage on the upper side via the intermediate duct, air that has been heated by the electrical component, which is at a high temperature, after the cooling air supply means stops is discharged via the exhaust passage part of the duct member without making contact with the electrical condenser on the lower side, thus promoting the release of heat from the interior of the case and thereby preventing any degradation in the durability of the electrical condenser.

Furthermore, in accordance with a third aspect of the present invention, since the electrical component includes the inverter and the DC-DC converter, which are arranged side by side in the vehicle width direction, and the heat sinks extending downward from the lower faces of the inverter and the DC-DC converter are made to face the second cooling air passage, not only is it possible to arrange the inverter and the DC-DC converter compactly, but it is also possible to efficiently cool the electrical component without increasing the circulation resistance of cooling air.

Moreover, in accordance with a fourth aspect of the present invention, since the intake passage part and the exhaust passage part are formed in the duct member provided on one end of the case so as to be adjacent to each other via the partition wall, it is possible to make the duct member compact and, moreover, since the inlet opening of the intake passage part and the outlet opening of the exhaust passage part are dividedly disposed at opposite ends in the lengthwise direction of the one end, it is easy to supply cooling air to the duct member and discharge it therefrom. Furthermore, since the width, in the lengthwise direction, of the outlet opening of the intake passage part is made substantially identical to the width, in the lengthwise direction, of the first cooling air passage, it is possible to ensure that the amount of cooling air introduced into the first cooling air passage is a maximum and, moreover, since the inlet opening of the exhaust passage part is provided within the width, in the lengthwise direction, of the outlet opening of the intake passage part, the dimension of the duct member in the lengthwise direction does not increase due to the inlet opening of the exhaust passage part.

Furthermore, in accordance with a fifth aspect of the present invention, since the passage cross-sectional area of the outlet opening of the intake passage part is larger than the passage cross-sectional area of the inlet opening of the intermediate duct, and the passage cross-sectional area of the outlet opening of the intermediate duct is larger than the passage cross-sectional area of the inlet opening of the exhaust passage part, the passage cross-sectional area for cooling air gradually decreases from the intake passage part toward the exhaust passage part, and the flow rate of cooling air gradually increases from the intake passage part toward the exhaust passage part. It is thereby possible to enhance the cooling effect by making cooling air having a high flow rate act on the electrical component, which attains a higher temperature than the battery module does.

Moreover, in accordance with a sixth aspect of the present invention, since the intermediate duct is formed in a U-shape that curves smoothly from the downstream end of the first cooling air passage to the upstream end of the second cooling air passage, cooling air can be guided smoothly from the first cooling air passage to the second cooling air passage.

Furthermore, in accordance with a seventh aspect of the present invention, since the intake duct, which is connected to the inlet opening of the intake passage part of the duct member, extends toward the front of the vehicle body, and the exhaust duct, which is connected to the outlet opening of the exhaust passage part of the duct member, extends toward the rear of the vehicle body, it is possible to prevent high temperature air discharged via the exhaust duct from being taken in via the intake duct.

Moreover, in accordance with an eighth aspect of the present invention, since the power unit is disposed underneath the floor of the luggage compartment interposed between the left and right side frames, it is possible to effectively protect the power unit while securing the cubic capacity of the luggage compartment.

BRIEF DESCRIPTION OF DRAWINGS

FIG. 8 is a diagram for explaining the operation when a cooling fan is stopped. (first embodiment)

EXPLANATION OF REFERENCE NUMERALS AND SYMBOLS

Figure 1:
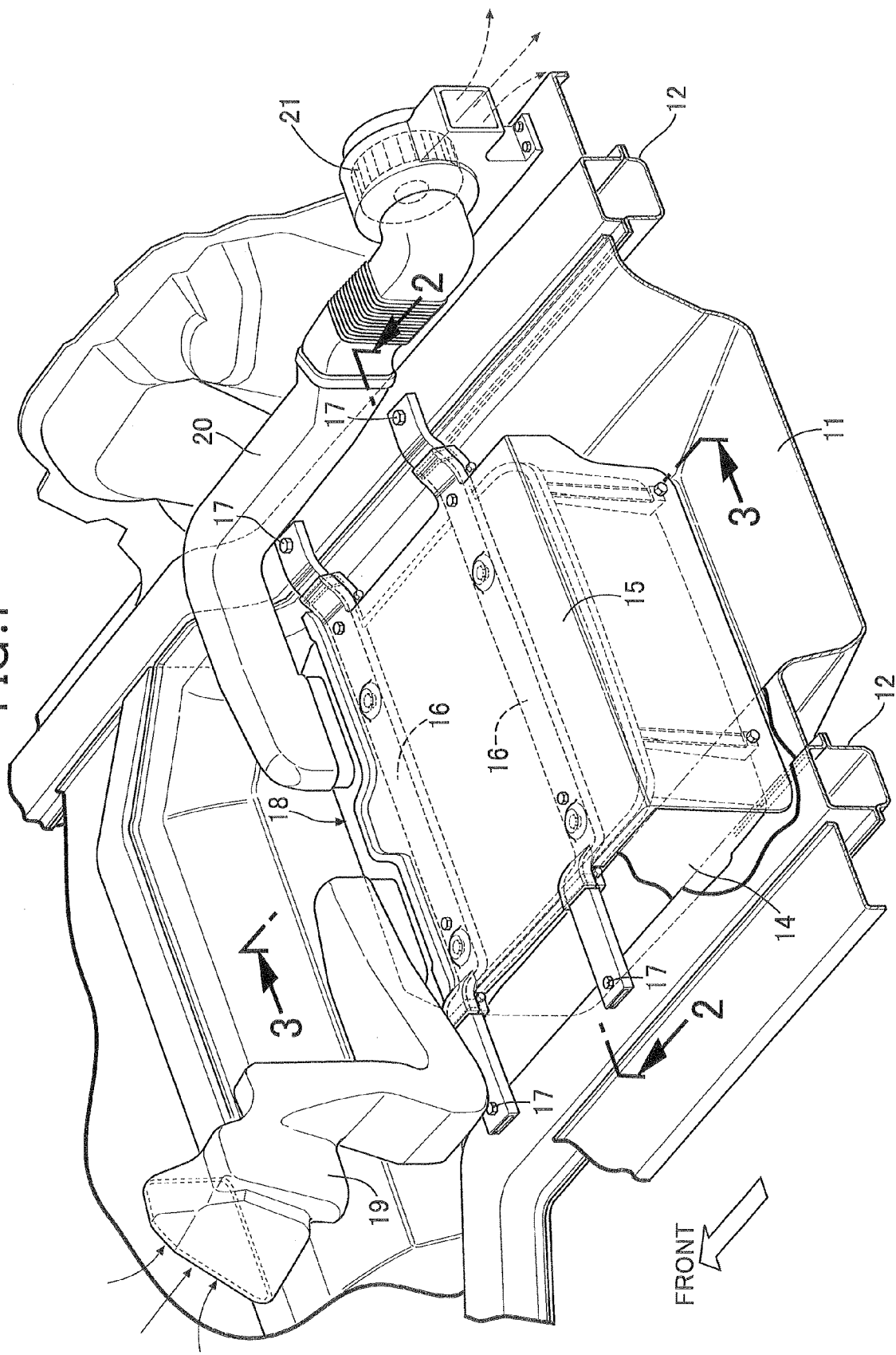
FIG. 1 is an overall perspective view of a vehicular power supply system (first embodiment).

14 Waterproof case (case)
18 Duct member
18*a* Partition wall
18*b* Inlet opening of intake passage part
18*c* Outlet opening of exhaust passage part
18*d* Outlet opening of intake passage part
18*e* Inlet opening of exhaust passage part
19 Intake duct
20 Exhaust duct
21 Cooling fan (cooling air supply means)
24 Battery module (electrical condenser)
33 Inverter (electrical component)
34 DC-DC converter (electrical component)
36 Intermediate duct 36a Inlet opening of intermediate duct
36b Outlet opening of intermediate duct
37 Heat sink
38 Heat sink
39 First cooling air passage
40 Second cooling air passage
41 Intake passage part
42 Exhaust passage part
43 Luggage compartment
P Power unit

BEST MODE FOR CARRYING OUT THE INVENTION

Modes for carrying out the present invention are explained below by reference to the attached drawings.

Embodiment 1

A first embodiment of the present invention is now explained by reference to FIG. 1 to FIG. 8.

As shown in FIG. 1, a power supply system for operating a motor/generator of a hybrid vehicle is housed by utilizing a tire pan 11 that houses a spare tire beneath a luggage compartment 43 (see FIG. 2 and FIG. 3) of a vehicle body rear part. The tire pan 11, which has a downwardly recessed container shape, has its left and right side edges connected to left and right rear side frames 12 and 12. The power supply system includes a waterproof case 14 having a container shape with an open upper face, and a flat plate-shaped lid member 15 closing the upper face opening, and opposite end parts, in the vehicle width direction, of a pair of front and rear hanger frames 16 and 16 extending in the vehicle width direction while being held between the waterproof case 14 and the lid member 15 are fixed to upper faces of the left and right rear side frames 12 and 12 by bolts 17. The power supply system is therefore hangingly supported by the left and right rear side frames 12 and 12 via the pair of front and rear hanger frames 16 and 16.

The front edge of the lid member 15 ends at the position of the front hanger frame 16, and a duct member 18 is housed within the waterproof case 14 in front of this position. Connected to an upper face of the duct member 18 are the downstream end of an intake duct 19 for taking, as cooling air, air within the vehicle compartment into the waterproof case 14, and the upstream end of an exhaust duct 20 for discharging from the interior of the waterproof case 14 cooling air that has completed cooling, the intake duct 19 extending toward the upper front left of the vehicle body from a front left part of the waterproof case 14, and the exhaust duct 20 extending rearward from a front right part of the waterproof case 14 along the right side face of the vehicle body. The downstream end of the exhaust duct 20 is provided with an electrically operated cooling fan 21, and cooling air is taken into the intake duct 19 by means of negative pressure generated by the cooling fan 21. Cooling air discharged from the intake duct 19 is discharged between an interior material of the luggage compartment 43 and a rear fender, part thereof is returned to the interior of the vehicle compartment, and part thereof is discharged outside the vehicle.

Figure 2:
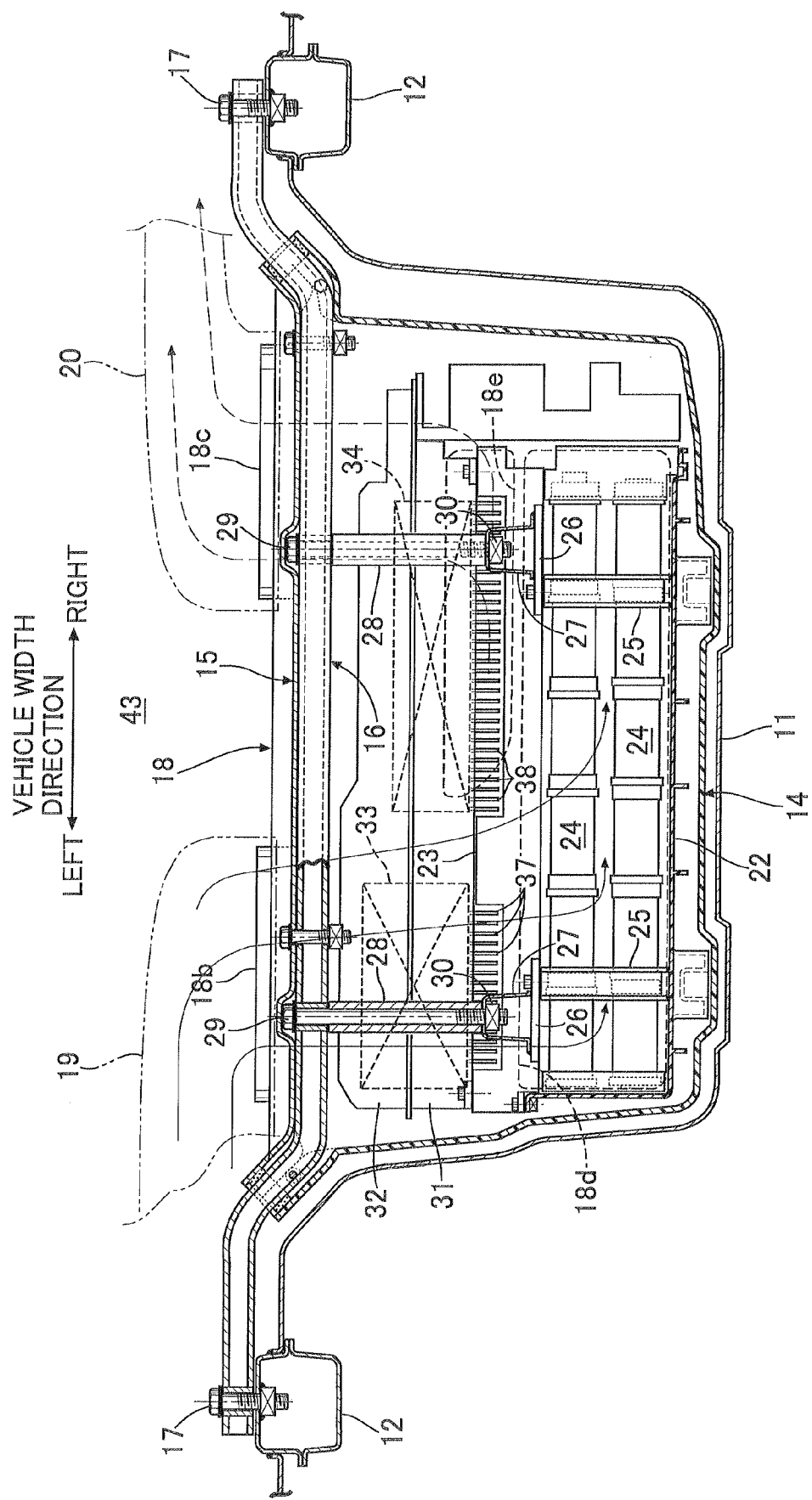
FIG. 2 is a sectional view along line 2-2 in FIG. 1. (first embodiment)
Figure 3:
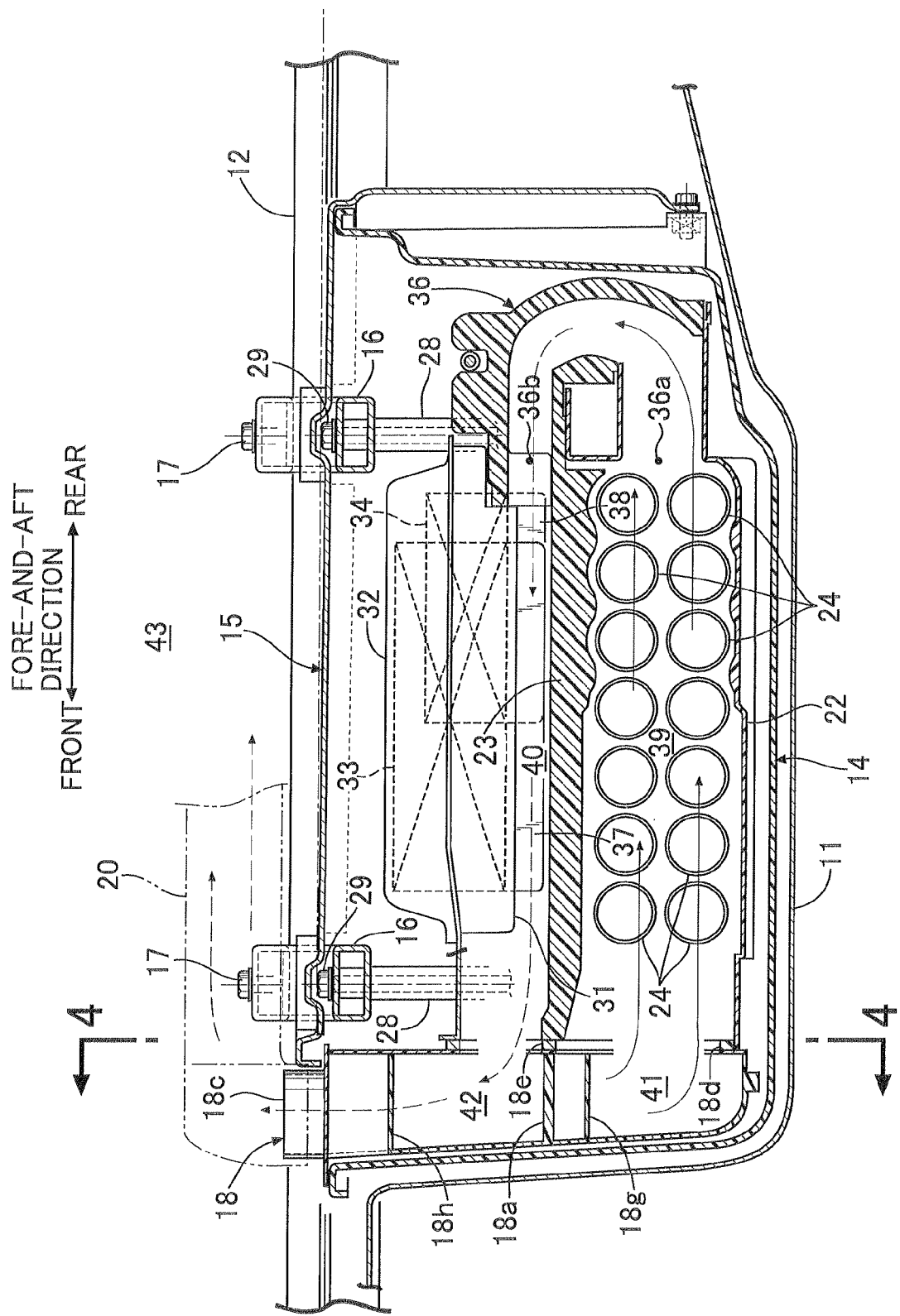
FIG. 3 is a sectional view along line 3-3 in FIG. 1. (first embodiment)
Figure 4:
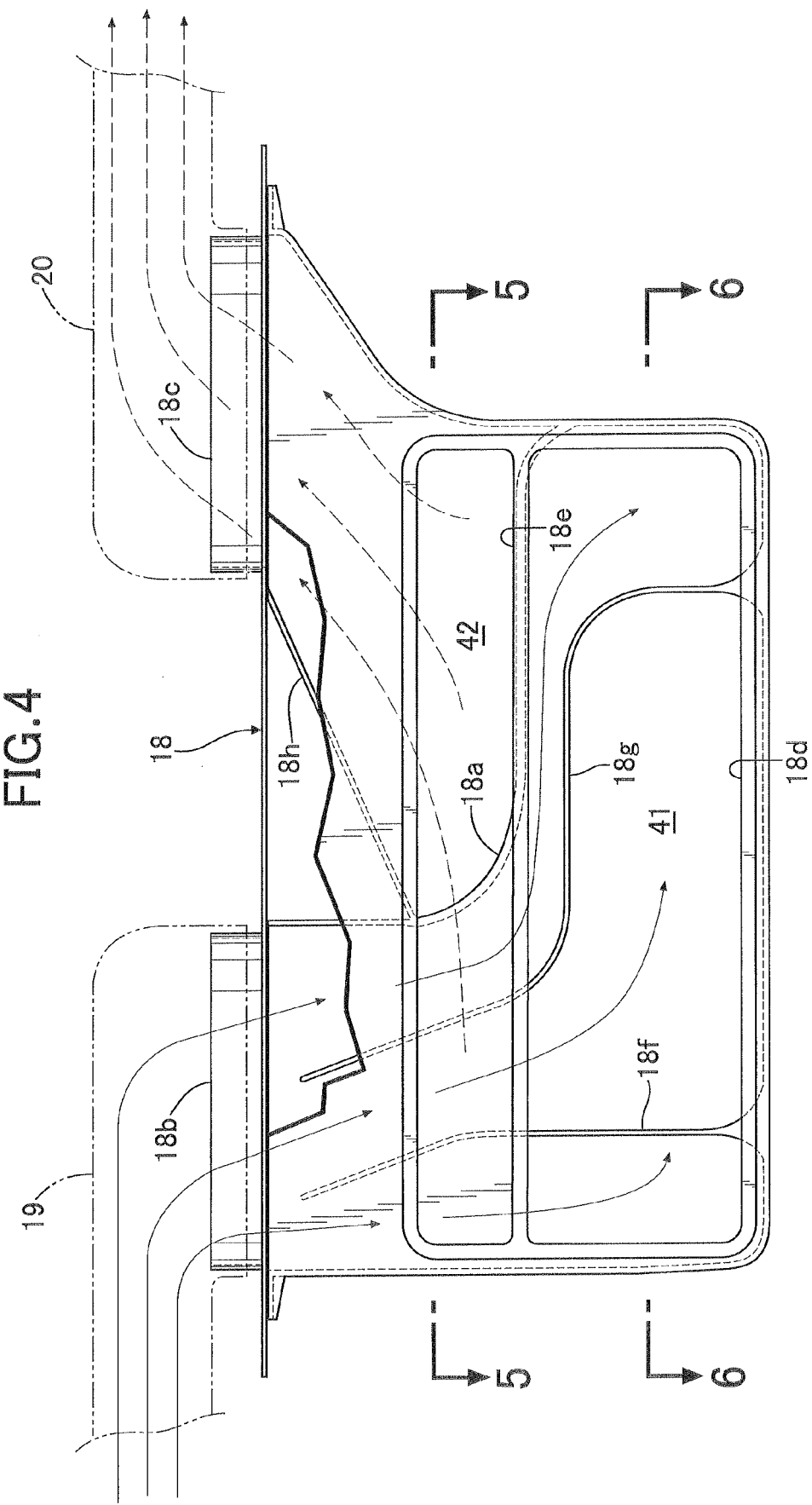
FIG. 4 is a view from arrowed line 4-4 in FIG. 3. (first embodiment)
Figure 5:
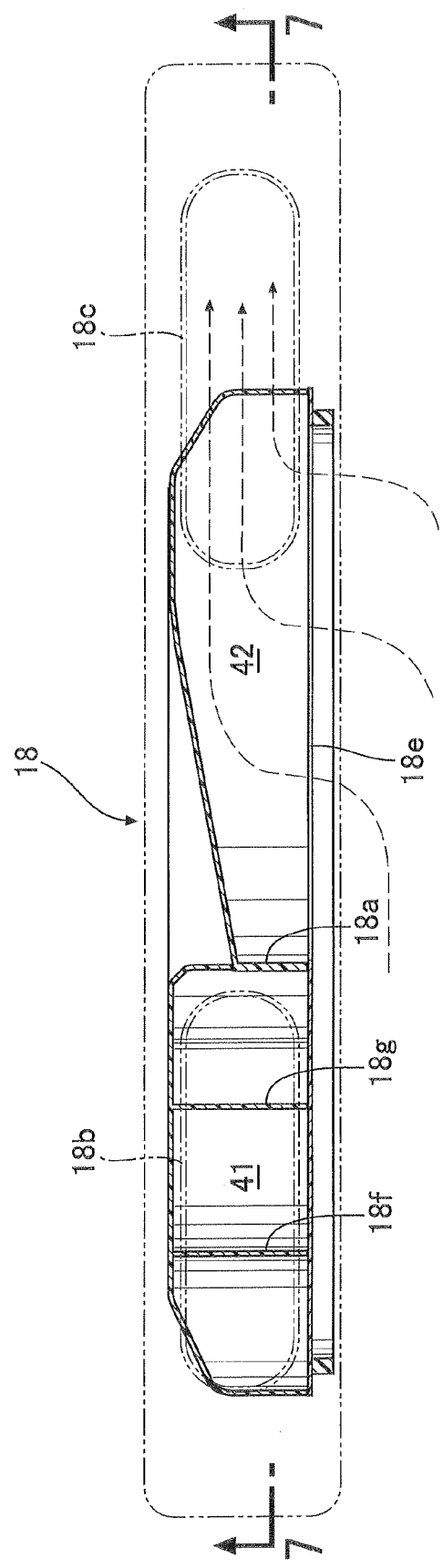
FIG. 5 is a sectional view along line 5-5 in FIG. 4. (first embodiment)
Figure 6:
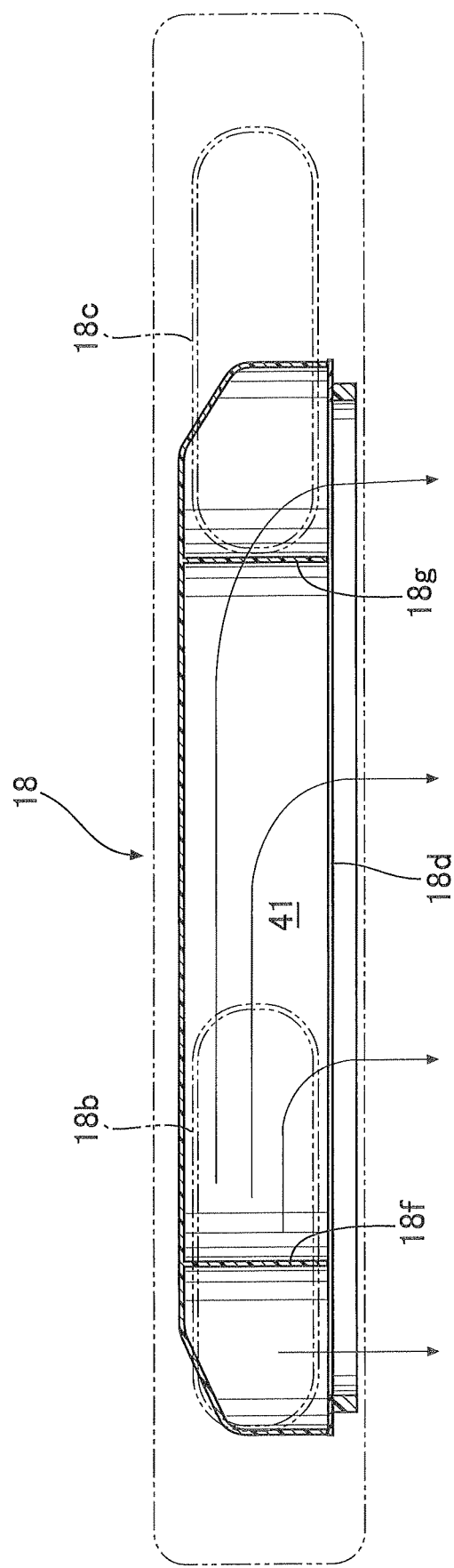
FIG. 6 is a sectional view along line 6-6 in FIG. 4. (first embodiment)
Figure 7:
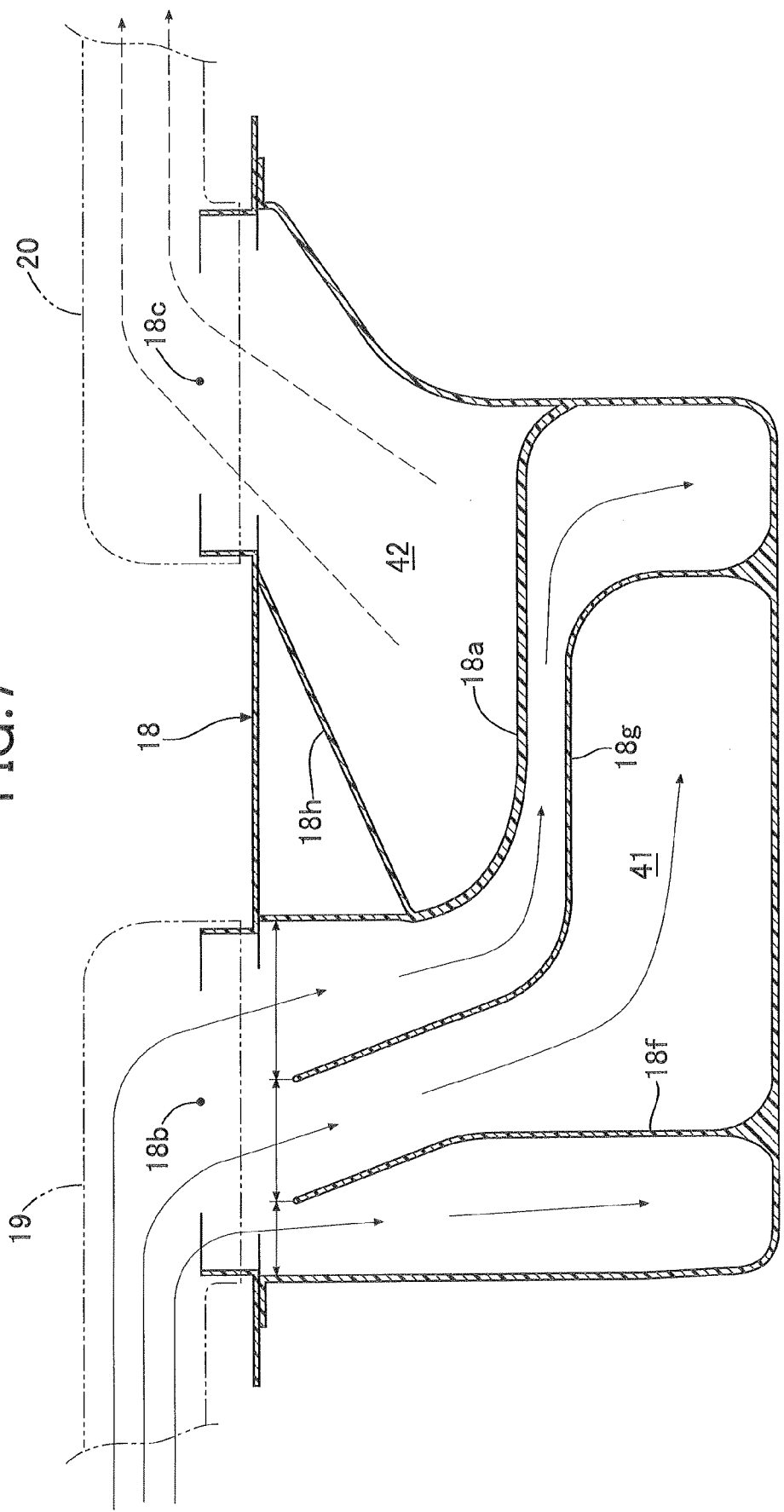
FIG. 7 is a sectional view along line 7-7 in FIG. 5. (first embodiment)

As shown in FIG. 2 and FIG. 3, a lower battery case 22 and an upper battery case 23 forming a first cooling air passage 39 are disposed in a bottom part of the waterproof case 14 disposed beneath the luggage compartment 43 so that a space is formed therebetween. Rod-shaped battery modules 24 in which a plurality of battery cells are connected in series in the vehicle width direction are arranged so that there are 7 rows in the fore-and-aft direction and two layers in the vertical direction, and housed in the interiors of the lower battery case 22 and the upper battery case 23 in a state in which they are bundled by a pair of left and right U-shaped lower battery support frames 25 and 25 and a pair of left and right I-shaped upper battery support frames 26 and 26 joined to upper ends thereof.

A pair of left and right brackets 27 and 27 provided on upper faces of the upper battery support frames 26 are connected to the hanger frames 16 by long bolts 29 and 29 having collars 28 and 28 fitted around the outer periphery and nuts 30 and 30 screwed around lower ends thereof. A total of 14 battery modules 24 are therefore hangingly supported on the front and rear hanger frames 16 by the four bolts 29.

A lower electrical component case 31 and an upper electrical component case 32 are fixed to an upper face of the upper battery case 23, and an inverter 33 and a DC-DC converter 34, which are high voltage electrical components, are arranged in the interior thereof on the left and right in the vehicle width direction. This enables the inverter 33 and the DC-DC converter 34 to be arranged compactly.

The battery modules 24, the inverter 33 and the DC-DC converter 34 form a power unit P of the present invention (see FIG. 8).

A second cooling air passage 40 is formed between the upper face of the upper battery case 23 and a lower face of the lower electrical component case 31, and in order to guide cooling air that has cooled the battery modules 24 to the second cooling air passage 40, an intermediate duct 36, which is curved in a U-shape, is provided in a rear part of the waterproof case 14. An inlet opening 36a of the intermediate duct 36 communicates with the downstream end of the first cooling air passage 39, and an outlet opening 36b of the intermediate duct 36 communicates with the upstream end of the second cooling air passage 40. In this way, since the intermediate duct 36 is formed in a U-shape by being smoothly curved from the downstream end of the first cooling air passage 39 to the upstream end of the second cooling air passage 40, cooling air can be smoothly guided from the first cooling air passage 39 to the second cooling air passage 40.

Heatsinks 37 and 38 extending downward from the inverter 33 and the DC-DC converter 34 respectively face the second cooling air passage 40. In this way, since the heatsinks 37 and 38 extending downward from lower faces of the inverter 33 and the DC-DC converter 34 face the second cooling air passage 40, the inverter 33 and the DC-DC converter 34 can be cooled efficiently without increasing the circulation resistance of cooling air.

The structure of the duct member 18 is now explained by reference to FIG. 3 to FIG. 7.

The duct member 18 is a box-shaped member, and its interior is partitioned by means of a partition wall 18a into an intake passage part 41 and an exhaust passage part 42. An inlet opening 18b, which is the upstream end of the intake passage part 41, is formed on the left-hand side of a flat upper face of the duct member 18, and triply divided outlet openings 18d, which are downstream ends of the intake passage part 41, are formed in a lower part of a flat rear face thereof. Furthermore, an outlet opening 18c, which is the downstream end of the exhaust passage part 42, is formed on the right-hand side of the flat upper face of the duct member 18, and an inlet opening 18e is formed on an upper side of the outlet openings 18d on the flat rear face thereof. The downstream end of the intake duct 19 is connected to the inlet opening 18b of the intake passage part 41 of the duct member 18, and the upstream end of the exhaust duct 20 is connected to the outlet opening 18c of the exhaust passage part 42 of the duct member 18.

The width, in the vehicle width direction, of the outlet openings 18d of the intake passage part 41 is substantially equal to the width, in the vehicle width direction, of the duct member 18, and matches the width, in the vehicle width direction, of the first cooling air passage 39 within the waterproof case 14. The outlet openings 18d of the intake passage part 41 are triply divided in order to avoid the positions of the pair of lower battery support frames 25 and 25, which bundle the battery modules 24. The interior of the intake passage part 41 of the duct member 18 is divided into three passages by means of two guide walls 18f and 18g, these three passages corresponding to the triply divided outlet openings 18d of the intake passage part 41.

The second cooling air passage 40 of the waterproof case 14 branches into left and right forks, the heat sink 37 of the inverter 33 facing one thereof, and the heat sink 38 of the DC-DC converter 34 facing the other. The passage cross-sectional area of the second cooling air passage 40 is therefore smaller than the passage cross-sectional area of the first cooling air passage 39.

With regard to the inlet opening 18e of the exhaust passage part 42 formed in the rear face of the intake duct 18, since a left-hand portion thereof is blocked by a dead-end wall, only the right-hand portion is actually open. That is, on the rear face of the duct member 18, the width, in the vehicle width direction, of the inlet opening 18e of the exhaust passage part 42 is smaller than the width, in the vehicle width direction, of the outlet openings 18d of the intake passage part 41, and is contained within the width, in the vehicle width direction, of the outlet openings 18d of the intake passage part 41. Furthermore, an inclined guide wall 18h guiding cooling air toward the outlet opening 18c is provided in an upper part of the exhaust passage part 42.

The operation of the embodiment of the present invention having the above-mentioned arrangement is now explained.

When the motor/generator of the hybrid vehicle is driven, high voltage electrical components including the battery modules 24, the inverter 33, and the DC-DC converter 34 generate heat. When the cooling fan 21 is driven, due to negative pressure generated on the upstream side thereof, air within the passenger compartment is taken via the intake duct 19 into the duct member 18 as cooling air. Cooling air flows into the intake passage part 41 via the inlet opening 18b formed on the left-hand side of the upper face of the duct member 18, is guided into the interior thereof by means of the two guide walls 18f and 18g to thus spread in the left-and-right direction, and flows into the first cooling air passage 39 via the triply divided outlet openings 18d.

As shown in FIG. 8 (A), cooling air cools the battery modules 24 while flowing through the first cooling air passage 39 from the front to the rear, then makes an upward U-turn due to the intermediate duct 36, and cools the inverter 33 and the DC-DC converter 34 by making contact with the heatsinks 37 and 38 while flowing from the rear to the front along the second cooling air passage 40, which has a smaller passage cross-sectional area than that of the first cooling air passage 39. Cooling air that has completed cooling as above flows into the exhaust passage part 42 via the inlet opening 18e formed in the rear face of the duct member 18 while being deflected toward the right and narrowing in passage cross-sectional area. Subsequently, it flows into the exhaust duct 20 via the outlet opening 18c formed on the right-hand side of the upper face of the duct member 18, passes through the cooling fan 21, and then divides into the interior of the passenger compartment and the exterior of the passenger compartment and is discharged.

In this process, since the intake duct 19, which is connected to the inlet opening 18b of the intake passage part 41 of the duct member 18, extends toward the front of the vehicle body, and the exhaust duct 20, which is connected to the outlet opening 18c of the exhaust passage part 42 of the duct member 18, extends toward the rear of the vehicle body, it is possible to prevent high temperature air discharged via the exhaust duct 20 from being taken in again via the intake duct 19. In this embodiment, since the inlet of the intake duct 19 and the outlet of the exhaust duct 20 are disposed at diagonal positions with the waterproof case 14 interposed therebetween, the above-mentioned effects can be exhibited yet more reliably.

As shown in FIG. 8 (B), since the interior of the waterproof case 14 is partitioned into the first cooling air passage 39 on the lower side and the second cooling air passage 40 on the upper side, the battery modules 24 is cooled with cooling air that is introduced from the intake passage part 41 of the duct member 18 and flows through the first cooling air passage 39 on the lower side, and the inverter 33 and the DC-DC converter 34 are then cooled by introducing the cooling air into the second cooling air passage 40 on the upper side via the intermediate duct 36, after the cooling fan 21 is stopped, air that has been heated by contact with the inverter 33 and the DC-DC converter 34, which have a relatively high temperature, does not flow toward the battery modules 24 side, which is on the lower side and has a relatively low temperature, but is discharged via the exhaust passage part 42 of the duct member 18, and it is thus possible to promote the release of heat from the interior of the waterproof case 14 while preventing degradation of the durability of the battery modules 24.

Furthermore, part of the air that has been heated by contact with the battery modules 24 in the first cooling air passage 39 flows toward the second cooling air passage 40 side on the upper side, and the remainder is discharged via the intake passage part 41 of the duct member 18. Since the temperature of air that has been heated by contact with the battery modules 24, which have a relatively low temperature, is lower than the temperature of air that has been heated by contact with the inverter 33 and the DC-DC converter 34, which have a relatively high temperature, even if the low temperature air flows toward the inverter 33 and DC-DC converter 34 side, it does not cause any problem but rather contributes to cooling of the inverter 33 and the DC-DC converter 34.

Moreover, since the intake passage part 41 and the exhaust passage part 42 are provided integrally with the duct member 18, which is provided at the front end of the waterproof case 14, compared with an arrangement in which the intake passage part 41 and the exhaust passage part 42 are provided separately at the front end and the rear end of the waterproof case 14, the power supply system can be made smaller. Since the power supply system which was made smaller is disposed beneath the floor of the luggage compartment 43 interposed between the left and right rear side frames 12 and 12, a crashable zone during a rear-end collision can be expanded compared with the conventional system.

Furthermore, since the intake passage part 41 and the exhaust passage part 42 are formed in the duct member 18 so as to be adjacent to each other via the partition wall 18a, the duct member 18 can be formed compactly, and by making the partition wall 18a thick or doubling it, it is possible to suppress the transmission of heat of high temperature cooling air flowing through the exhaust passage part 42 to low temperature cooling air flowing through the intake passage part 41. Moreover, since the inlet opening 18*b* of the intake passage part 41 and the outlet opening 18*c* of the exhaust passage part 42 are dividedly disposed on the left and right in the vehicle width direction, it is easy to supply cooling air to the duct member 18 and discharge it therefrom.

Furthermore, since the width, in the vehicle width direction, of the outlet openings 18*d* of the intake passage part 41 of the duct member 18 is substantially the same as the width, in the vehicle width direction, of the first cooling air passage 39, it is possible to ensure that the amount of cooling air introduced into the first cooling air passage 39 is a maximum and, moreover, since the inlet opening 18*e* of the exhaust passage part 42 is provided within the width, in the vehicle width direction, of the outlet openings 18*d* of the intake passage part 41, the dimension of the duct member 18 in the vehicle width direction does not increase due to the inlet opening 18*e* of the exhaust passage part 42.

Furthermore, since the passage cross-sectional area of the outlet openings 18*d* of the intake passage part 41 is larger than the passage cross-sectional area of the inlet opening 36*a* of the intermediate duct 36, and the passage cross-sectional area of the outlet opening 36*b* of the intermediate duct 36 is larger than the passage cross-sectional area of the inlet opening 18*e* of the exhaust passage part 42, the passage cross-sectional area for cooling air gradually decreases from the intake passage part 41 toward the exhaust passage part 42, and the flow rate of cooling air gradually increases from the intake passage part 41 toward the exhaust passage part 42. It is thus possible to enhance the cooling effect by making high flow rate cooling air act on the inverter 33 and the DC-DC converter 34, which attain a higher temperature than the battery modules 24 do.

Embodiment 2

Figure 9:
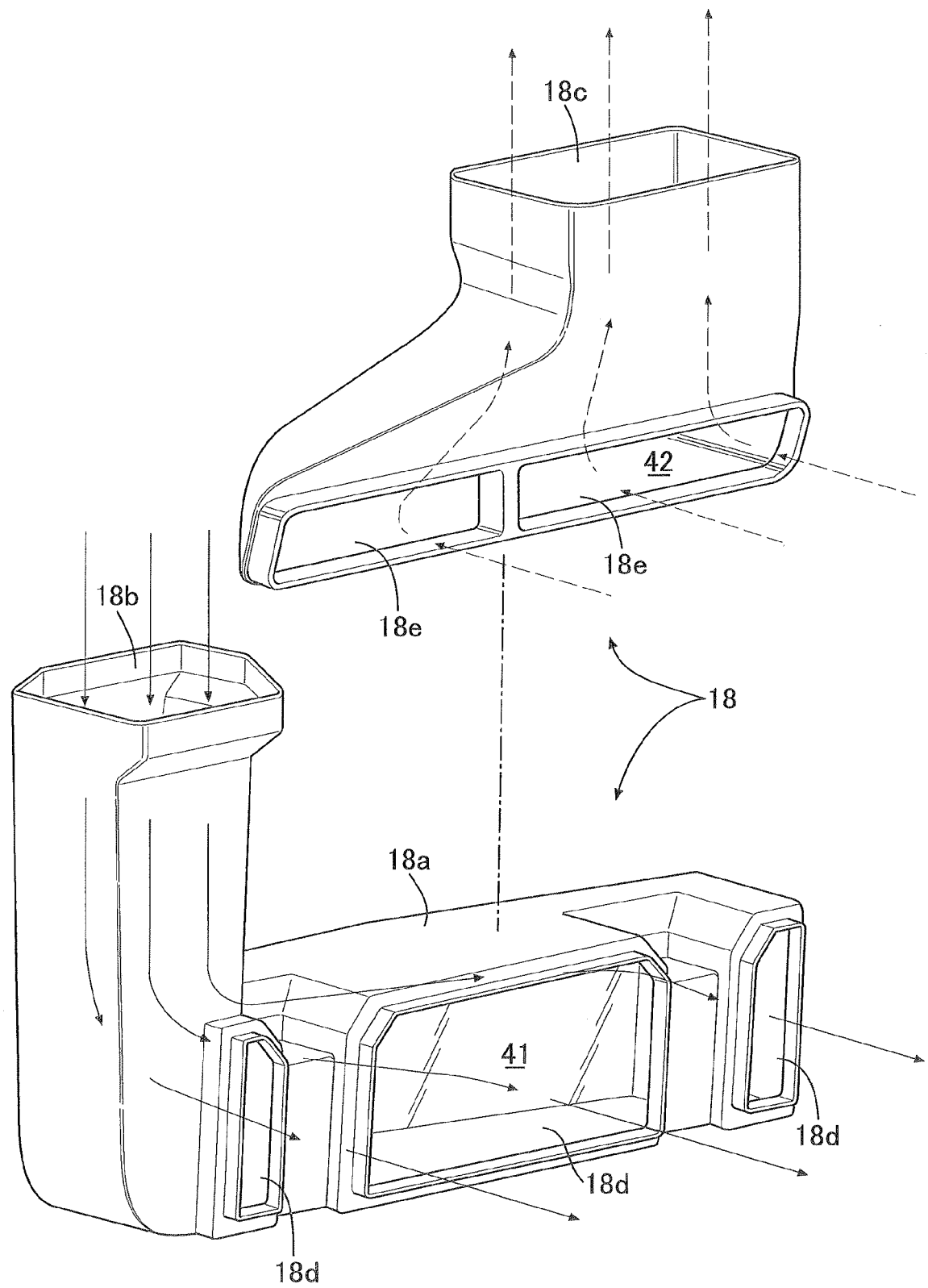
FIG. 9 is an exploded perspective view of a duct member. (second embodiment)

A second embodiment of the present invention is now explained by reference to FIG. 9.

For a duct member 18 of the second embodiment, an intake passage part 41 and an exhaust passage part 42 are formed from separate members, and the duct member 18 is formed by integrally joining them. In this embodiment, although the number of components increases compared with the first embodiment, the degree of freedom in design of the shape of the duct member 18 can be increased.

Embodiments of the present invention are explained above, but the present invention is not limited to the above-mentioned embodiments and can be modified in a variety of ways as long as the modifications do not depart from the spirit and scope thereof.

For example, in the embodiments a hybrid vehicle is illustrated, but the present invention may be applied to an electric automobile.

Furthermore, in the embodiments, the duct member 18 is disposed along a front face of the waterproof case 14, but it may be disposed along a left-hand or right-hand side face of the waterproof case 14.

The invention claimed is:

1. A vehicular power supply system in which a power unit comprising an electrical condenser and at least one electrical component is disposed within a case, the interior of the case is partitioned into a first cooling air passage and a second cooling air passage, cooling air is supplied to the first and second cooling air passages by cooling air supply means, the electrical condenser is cooled by cooling air flowing through the first cooling air passage, and the at least one electrical component is cooled by cooling air flowing through the second cooling air passage, wherein a duct member integrally comprising an intake passage part and an exhaust passage part is provided at one end of the case, an outlet opening of the intake passage part is connected to the upstream end of the first cooling air passage, an inlet opening of the exhaust passage part is connected to the downstream end of the second cooling air passage, and the downstream end of the first cooling air passage and the upstream end of the second cooling air passage are connected via an intermediate duct at the other end of the case, and the at east one electrical component comprises an inverter and a DC-DC converter arranged side by side in the vehicle width direction, and heat sinks extending downward from lower faces of the inverter and the DC-DC converter face the second cooling air passage.

2. The vehicular power supply system according to claim 1, wherein the first cooling air passage is provided under the second cooling air passage.

3. The vehicular power supply system according to either claim 1 or claim 2, wherein the intake passage part and the exhaust passage part of the duct member provided on one end of the case are formed so as to be adjacent to each other with a partition wall interposed therebetween, an inlet opening of the intake passage part and an outlet opening of the exhaust passage part are dividedly disposed at opposite ends in a lengthwise direction on said one end, a width of the outlet opening of the intake passage part is substantially the same as a width of the first cooling air passage, and the inlet opening of the exhaust passage part is provided within the width of the outlet opening of the intake passage part.

4. The vehicular power supply system according to either claim 1 or claim 2, wherein the passage cross-sectional area of the outlet opening of the intake passage part is larger than the passage cross-sectional area of the inlet opening of the intermediate duct, and the passage cross-sectional area of the outlet opening of the intermediate duct is larger than the passage cross-sectional area of the inlet opening of the exhaust passage part.

5. The vehicular power supply system according to either claim 1 or claim 2, wherein the intermediate duct is formed in a U-shape that curves smoothly from the downstream end of the first cooling air passage to the upstream end of the second cooling air passage.

6. The vehicular power supply system according to either claim 1 or claim 2, wherein an intake duct connected to the inlet opening of the intake passage part of the duct member extends toward a front portion of a vehicle body, and an exhaust duct connected to the outlet opening of the exhaust passage part of the duct member extends toward a rear portion of the vehicle body.

7. The vehicular power supply system according to either claim 1 or claim 2, wherein the power unit is disposed underneath a floor of a luggage compartment interposed between left and right side frames.

\* \* \* \* \*